United States Patent
Koller

(10) Patent No.: US 10,811,297 B2
(45) Date of Patent: Oct. 20, 2020

(54) WAFER EXPANDER

(71) Applicant: Infineon Technologies AG, Neubiberg (DE)

(72) Inventor: Adolf Koller, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 327 days.

(21) Appl. No.: 15/613,156

(22) Filed: Jun. 3, 2017

(65) Prior Publication Data

US 2017/0352572 A1    Dec. 7, 2017

(30) Foreign Application Priority Data

Jun. 7, 2016 (DE) .................. 10 2016 110 503

(51) Int. Cl.
*H01L 21/683* (2006.01)
*H01L 21/67* (2006.01)

(52) U.S. Cl.
CPC .... *H01L 21/6836* (2013.01); *H01L 21/67132* (2013.01); *H01L 2221/68336* (2013.01)

(58) Field of Classification Search
CPC ........... H01L 21/6836; H01L 21/67132; H01L 2221/68336

See application file for complete search history.

(56) References Cited

U.S. PATENT DOCUMENTS

2006/0005911 A1\* 1/2006 Kubo ................. H01L 21/6836
156/84
2019/0271733 A1\* 9/2019 Hayashishita .......... H01L 21/78

FOREIGN PATENT DOCUMENTS

| JP | 2010-192510 A |   | 9/2010 |
| JP | 2013-239663 A |   | 11/2013 |
| JP | 2016012584 A | \* | 1/2016 |

\* cited by examiner

*Primary Examiner* — Edward Chin

(57) ABSTRACT

An apparatus for expanding chips of a wafer, wherein the apparatus comprises an expansion mechanism configured for expanding a tape on which the chips of the wafer are arranged, and an inflation mechanism configured for inflating at least a part of an edge portion of the tape so that part of the edge portion approaches a frame.

15 Claims, 7 Drawing Sheets

WAFER EXPANDER

BACKGROUND OF THE INVENTION

Field of the invention

The present invention relates to apparatuses for and methods of expanding chips of a wafer, and relates to an arrangement.

Description of the Related Art

Packages may be denoted as encapsulated electronic chips with electrical connects extending out of the encapsulant and being mounted to an electronic periphery, for instance on a printed circuit board. Before packaging, a semiconductor wafer is singularized into a plurality of electronic chips. During and/or after singularizing the wafer into the singularized electronic chips, the electronic chips of the wafer may be spatially expanded on an adhesive tape so that separation and picking of the individual chips is simplified.

During the expansion, the electronic chips of the wafer may be arranged on an adhesive tape which may be held on a frame. For handling the electronic chips of the wafer in terms of expansion, it is conventionally necessary to carry out cumbersome procedures such as relamination of the wafer chips on different tapes, use of very large frames, etc. This may conventionally render wafer expansion difficult and cumbersome.

SUMMARY OF THE INVENTION

There may be a need to provide a possibility of expanding chips of a wafer with reasonable effort.

According to an exemplary embodiment, an apparatus for expanding chips of a wafer is provided, wherein the apparatus comprises an expansion mechanism configured for expanding a tape on which the chips of the wafer are arranged, and an inflation mechanism configured for inflating at least a part of an edge portion of the tape so that part of the edge portion approaches a frame.

According to another exemplary embodiment, an apparatus for expanding chips of a wafer is provided, wherein the apparatus comprises an expansion mechanism configured for expanding a tape on which the chips of the wafer are arranged, a clamping mechanism configured for clamping the expanded tape at a position between a chip carrying portion of the tape and an edge portion of the tape, and an approaching mechanism configured for approaching at least a part of the edge portion of the tape to a frame.

According to still another exemplary embodiment, a method of expanding chips of a wafer is provided, wherein the method comprises expanding a tape on which the chips of the wafer are arranged, optionally clamping the expanded tape at a position between a chip carrying portion of the tape and an edge portion of the tape, inflating at least a part of the edge portion of the tape so that part of the edge portion approaches a frame, and bringing the approached inflated part in contact with the frame.

According to yet another exemplary embodiment, a method of expanding chips of a wafer is provided, wherein the method comprises expanding a tape on which the chips of the wafer are arranged, optionally clamping the expanded tape at a position between a chip carrying portion of the tape and an edge portion of the tape, approaching at least a part of the edge portion of the tape to a frame, and rolling the approached part onto the frame.

According to still another exemplary embodiment, an arrangement is provided which comprises an adhesive tape, a plurality of chips of an expanded wafer adhered on an expanded chip carrying portion of the tape, and a frame on which an expanded connection portion of the tape is secured (in particular adhered).

According to an exemplary embodiment of the invention, simple and efficient expansion of chips of a wafer to be singularized is provided, in which the expansion as well as the connection of an expanded tape with wafer chips to a frame may be accomplished with reasonable effort. For this purpose, the expansion of the flexible or elastic or stretchy adhesive tape can be followed by a temporary clamping of the tape at a position between a chip carrying portion carrying the chips of the wafer on the one hand, and an edge portion of the tape which is to be connected with the frame. In particular in this clamped state, it is possible to spatially approach the (in particular adhesive) edge portion of the tape towards the frame, in particular by inflating at least part of the edge portion so that an inflated tape section is moved in a direction towards the frame. This makes it possible to attach the inflated adhesive tape section onto the frame, so that this frame with attached adhesive tape and expanded chips can be conveniently handled as an arrangement for further processing.

The described wafer chip expanding architecture is advantageously compatible with the use of relatively small frame sizes, renders the use of multiple tapes including relamination dispensable, and therefore simplifies wafer expansion in terms of one or more tasks such as singularization, monitoring, pick and place treatment, etc. This also allows to ship an arrangement of frame, tape and expanded wafer with a compact size. Moreover, the described concept does not require relamination of the wafer onto a second tape and can hence be used even with chips having a main surface which cannot be adhered directly onto an adhesive tape without damaging sensitive integrated circuit elements (such as membranes of a microelectromechanical system (MEMS) chip) on this main surface. Thus, the flexibility of expanding wafers with very different types of chips can be increased.

DESCRIPTION OF FURTHER EXEMPLARY EMBODIMENTS

In the following, further exemplary embodiments of the apparatuses, the methods, and the arrangement will be explained.

In the context of the present application, the term "wafer" may particularly denote a semiconductor substrate which has been processed to form a plurality of integrated circuit elements in an active region of the wafer and which may be, when being expanded according to an exemplary embodiment, already singularized into a plurality of separate electronic chips. For example, a wafer may have a disk shape and may comprise a matrix-like arrangement of electronic chips in rows and columns. It is possible that a wafer has a circular geometry or a polygonal geometry (such as a rectangular geometry or a triangular geometry).

In the context of the present application, the term "electronic chip" may particularly denote a naked die, i.e. a non-packaged (for instance non-molded) chip made of a processed semiconductor, for instance a singulated piece of a semiconductor wafer. A semiconductor chip may however also be an already packaged (for instance molded or laminated) die. One or more integrated circuit elements (such as a MEMS, a diode, a transistor, etc.) may be formed within the semiconductor chip. Such a semiconductor chip may be equipped with a metallization, in particular with one or more pads.

In the context of the present application, the term "singularizing" may particularly denote the procedure of separating an integral wafer into a plurality of separate electronic chips as sections of the previous wafer. Such a singularization may be accomplished by sawing, laser cutting, plasma treatment, etching, etc. It is also possible to accomplish singularization by self-dicing (for instance by selectively thinning regions of the wafer between adjacent electronic chips, followed by a singularization by tearing or expanding the wafer to thereby break it into separated electronic chips at the thinned regions, serving as predetermined breaking points.

In an embodiment, the apparatus further comprises a clamping mechanism configured for clamping the previously extended tape at a position between a chip carrying portion (which carries the chips of the wafer) of the tape and the edge portion (which is to be connected to a frame) of the tape. Such a clamping architecture allows to precisely define which portion of the tape is subsequently subjected to inflation, and which not.

In an embodiment, the apparatus further comprises a roll mechanism configured for rolling an approached part onto the frame. This ensures a firm connection between expanded tape and frame.

In an embodiment, singularization of the wafer prior and/or during expansion may be accomplished by laser processing, by plasma processing or by mechanically cutting (for instance with a diamond blade). In particular singularization by laser processing or plasma processing can be advantageously supported or promoted by an expansion of the wafer.

In an embodiment, the apparatus comprises a contacting mechanism configured for bringing the approached inflated part in contact with the frame. The contacting mechanism in fact attaches a tape section approached to the frame onto the same. This can be accomplished by simply pushing or pressing an adhesive tape portion onto the frame, or by laminating the tape portion onto the frame (in particular by the application of pressure and/or increased temperature). In particular, the contacting mechanism may be configured for bringing the approached inflated part in contact with the frame by one of the group consisting of applying pressure and applying a rolling force. However, other techniques of securely connecting the tape portion to the frame can be implemented.

In an embodiment, the expansion mechanism is configured for fixing an end portion of the tape and for exerting a pulling force to the end portion to thereby expand the tape. For instance, the end portion of the tape may be fixed between a further frame and a clamp element of the expansion mechanism. The fixed end portion of the tape may then be moved together with at least a portion of the expansion mechanism which will stretch and therefore expand the elastic tape.

In an embodiment, the expansion mechanism is configured for exerting the pulling force to the end portion along a pulling direction which is angled relative to the chip carrying portion of the tape. In particular, a plane defined by the chip carrying portion of the tape (i.e. the portion of the tape on which the wafer is mounted) may be perpendicular to the pulling direction. During a corresponding expansion procedure, the expansion of the tape in response to the pulling force may involve a motion of a tape portion over an angled edge, so that this tape portion changes motion direction during the expanding.

In an embodiment, the expansion mechanism is configured for fixing a further frame connected with the end portion of the tape during expanding, clamping and inflating. This further frame may be a frame with which the tape to be expanded and the wafer to be expanded may be already connected prior to the expansion. Advantageously, the frame and the further frame have the same size. In view of the described expansion method, the use of a further frame of significantly larger dimension than the frame to which the expanded wafer is connected at the end of the expansion procedure may be dispensable, thereby reducing the effort connected with the expansion procedure. Such a significantly larger frame is necessary in conventional procedures in view of the increase of the size of the tape due to the expansion. In a nutshell, the tape may be fixed to the preliminary, temporary or further frame before the expansion, and may be fixed to the final frame thereafter.

In an embodiment, the clamping mechanism is configured for clamping the expanded tape between a support structure and a bending edge over which the tape is bent during expanding. Thus, after the expansion, a position of the tape may be immobilized by the clamping force to thereby make it possible to subsequently inflate selectively an edge portion of the tape on one side of the clamping position, while the chip carrying portion on the other side of the clamping position may rest in a fixed position without being inflated or moved.

In an embodiment, the frame is located on (and for instance temporarily held by) the support structure, for instance adjacent to the bending edge. When the frame to which the expanded wafer and the tape shall be connected at the end of the handling procedure is already located close to the bending edge, inflation of the edge portion of the tape will automatically result in an approaching motion of the edge portion of the tape towards the frame. Thus, it is of particular advantage to arrange the frame on a surface of the support structure neighbouring the bending edge, which surface also faces (rather than opposes) the edge portion of the tape.

In an embodiment, the inflation mechanism is configured for inflating the edge portion by applying a pneumatic pressure. In particular, the edge portion may be inflated by gas pressure, more particularly air pressure. This is a very simple and efficient mechanism of forcing the edge portion to approach the frame without any risk of damaging or contaminating the thin tape. Alternatively, inflation may be accomplished by a hydraulic mechanism (for instance involving water, oil, an organic solvent or any other liquid for inflating or widening up a portion of the elastic tape). Further alternatively, it is possible to implement a mechanical mechanism of inflating the edge portion, for instance pressing a solid body against the edge portion so that the latter inflates and thereby approaches the frame. In such a configuration, care should be taken to prevent mechanical damage of the thin tape by the body during the inflation. In particular, the inflation mechanism may be configured for inflating the edge portion so that the edge portion assumes a toroidal shape.

In an embodiment, the inflation mechanism is configured for inflating the edge portion while the chip carrying portion is protected from being inflated. Thus, the sensitive chips of the already expanded wafer may remain uninfluenced by the further treatment of the edge portion of the tape for accomplishing attachment to the (advantageously reasonably small dimensioned) frame. This can be accomplished by the above described temporary clamping procedure.

In an embodiment, the contacting mechanism is configured for attaching, in particular adhering, the approached inflated part to the frame. A corresponding adhesive can be applied on the tape and/or on the frame. The connection may be also accomplished by lamination, i.e. the application of pressure and/or heat.

In an embodiment, the expansion mechanism and the clamping mechanism are configured for being movable relative to one another for further approaching the inflated part towards the frame. In particular after the inflation resulting in an approaching of a part of the edge portion towards the frame, this approaching motion may be further supported or promoted by a mutual motion between expansion mechanism and clamping mechanism. In particular, it may be appropriate that the expansion mechanism moves back towards the clamping edge, i.e. along a motion direction opposing a motion direction along which the expansion mechanism had been moved in terms of the foregoing expansion of the tape and the chips of the wafer.

In an embodiment, the contacting mechanism comprises a roll configured for rolling the approached inflated part in contact with the frame. Thus, by rolling the approached inflated part onto the frame by a roll applying a rolling force onto the tape being located on or close to the frame, a reliable connection between tape and frame may be accomplished.

In an embodiment, the apparatus comprises a tape relaxing mechanism configured for relaxing the tape after rolling with the roll. Hence, after the above described connection by rolling, at least a part of the tension of the tape may be optionally removed by allowing the latter to relax. This may improve mechanical integrity of the arrangement of tape, frame and expanded wafer to be manufactured.

In an embodiment, the contacting mechanism comprises a further roll configured for further rolling the approached inflated part in contact with the frame after rolling with the roll. Advantageously, the further roll may be larger than the roll so as to refine, improve or spatially extend adhesion of the tape on the frame. By the described double roll attachment mechanism, optionally in combination with an intermediate relaxing procedure, a reliable connection between frame and tape may be accomplished.

In an embodiment, at least one of the roll and the further roll is convertible between an expanded and a retracted configuration. Additionally or alternatively, at least one of the roll and the further roll is stored, in an inactive state, within an inflation chamber of the inflation mechanism. The described measures allow for a compact configuration of the apparatus and for a quick execution of the method in view of the close spatial location of the individual components of the apparatus.

In an embodiment, the contacting mechanism is configured for securely connecting the inflated part with the frame. Such a secure connection may be an adhesive connection.

In an embodiment, at least during the expanding and the clamping, an end portion of the tape is connected to a further frame. Thus, during execution of the expansion method, two frames may be used for connection with the tape. The above mentioned frame may be used for the final connection of expanded tape with expanded wafer. The above-mentioned further frame may be used temporarily for holding the tape during the expansion procedure.

In an embodiment, the apparatus comprises a separation mechanism (in particular a cutting mechanism) configured for separating (in particular cutting off) a part of the edge portion of the tape being not in contact with the frame. Separation may be accomplished by a mechanical separation technique, for instance by a cutting blade or knife. Alternatively, separation may be accomplished by a laser separation. Separation of the part of the edge portion of the tape overlapping the exterior end of the frame may be optionally performed for simplifying handling of the final arrangement.

In an embodiment of the arrangement, the tape has a smaller thickness in the expanded connection portion (i.e. on the frame) than in the expanded chip carrying portion (i.e. in a region being surrounded by the frame). The reason for these different thicknesses of the different portions of the tape (with originally homogeneous thickness) of the arrangement is a result of the fact that the chip carrying portion has been subject only to a single expansion procedure, whereas the edge portion (forming the basis for the expanded connection portion) has been subject to the expansion procedure of the chip carrying portion as well as to the additional expansion procedure in terms of the inflation. Thus, the smaller thickness of the expanded connection portion connected to the frame is the fingerprint of the manufacture of the arrangement according to the above described method.

In an embodiment, at least a part of the expanded connection portion is adhered on the frame under tension. Thus, at least the outermost ring of the expanded connection portion connected to the frame may be still in an expanded and hence mechanically tensed state. The expanded connection portion may be still laterally stretched and remains in this stretched state in view of its firm connection to the frame. In other words, in the hypothetical case that the expanded connection portion would be separated from the frame, the expanded connection portion would contract into a force free state.

In an embodiment, the chips have an exterior main surface opposing the tape with an exposed integrated circuit element being destroyable by adhesion on an adhesive tape. For instance in terms of MEMS (microelectromechanical system) chips, a movable element (such as a membrane or a cantilever) of such a MEMS chip may be exposed on one main surface of the chips. When attaching such a main surface with the movable element or other sensitive exposed integrated circuit element on an adhesive tape, this integrated circuit element can be mechanically destroyed, deteriorated or damaged. Since the described manufacturing procedure does not require relamination of the chips and therefore attachment of an adhesive tape on the exterior main surface with the exposed integrated circuit element, the chips are prevented from damage. In other words, the described manufacturing architecture is compatible with any kind of chips, even those with one sensitive main surface, which do not allow relamination.

In another embodiment, the electronic chips are power semiconductor chips. Such a power semiconductor chip may have integrated therein one or multiple integrated circuit elements such as transistors (for instance field effect transistors like metal oxide semiconductor field effect transistors and/or bipolar transistors such as insulated gate bipolar transistors) and/or diodes. Exemplary applications which can be provided by such integrated circuit elements are switching purposes. For example, such another integrated circuit element of a power semiconductor device may be integrated in a half-bridge or a full bridge. Exemplary applications are automotive applications.

The one or more semiconductor chips may comprise at least one of the group consisting of a diode, and a transistor, more particularly an insulated gate bipolar transistor. For instance, the one or more electronic chips may be used as semiconductor chips for power applications for instance in the automotive field. In an embodiment, at least one semiconductor chip may comprise a logic IC or a semiconductor chip for RF power applications. In one embodiment, the semiconductor chip(s) may be used as one or more sensors or actuators in microelectromechanical systems (MEMS), for example as pressure sensors or acceleration sensors, as a microphone, as a loudspeaker, etc.

As substrate or wafer for the semiconductor chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings.

DETAILED DESCRIPTION OF EXEMPLARY EMBODIMENTS

Figure 1:
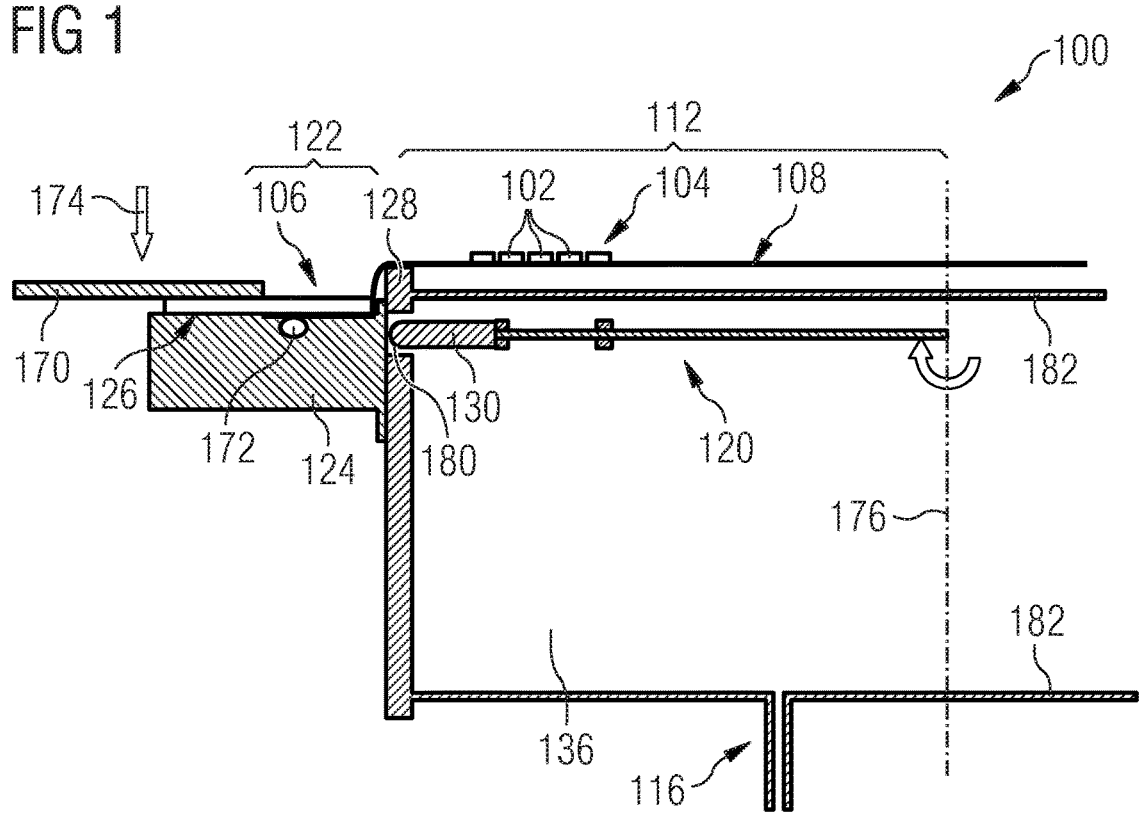
FIG. 1 to FIG. 10 show different views of an apparatus for expanding chips of a wafer according to an exemplary embodiment of the invention in different operation states during carrying out a method of expanding the chips of the wafer.

The illustration in the drawing is schematically and not to scale.

Before exemplary embodiments will be described in more detail referring to the figures, some general considerations will be summarized based on which exemplary embodiments have been developed.

According to an exemplary embodiment of the invention, a wafer expander is provided using the same frame size (for instance 12") for a final frame (i.e. holding the tape after the expansion) and for a temporary frame (i.e. holding the tape prior to the extension). Thus, expansion of a wafer on a tape using the same sawing frame size as after wafer expansion may be made possible.

In an embodiment, the wafer may be directly expanded and clamped on a sawing frame (on which optionally also the singularization of the wafer can be carried out). After expanding and clamping, the tape which has been torn downwardly can be relaxed and simultaneously filled with pressurized air. This results in the formation of a toroid. One or more rolls which have been previously retracted within an expansion device may then be swung out or expanded and can roll the tape onto another frame (in particular having the same size as the previously mentioned sawing frame). After an optional further relaxing of the adhesive tape, the tape on the frame can be rolled on again. Finally, it is possible to cut off a portion of the tape projecting beyond the frame, if desired.

Such a procedure has the advantage that the wafer neither requires relamination onto an additional tape nor mounting on a larger frame. In contrast to this, a method according to an exemplary embodiment expands a tape fixed on a sawing frame and fixes the same tape subsequently on the other frame having preferably the same size as the sawing frame.

FIG. 1 to FIG. 10 show different views of an apparatus 100, which can also be denoted as die tape extender, for expanding semiconductor chips 102 of a semiconductor wafer 104 (only shown schematically) according to an exemplary embodiment of the invention in different operation states during carrying out a method of expanding the chips 102 of the wafer 104. Apparatus 100 is substantially rotationally symmetric along a virtual symmetry axis 176, and only a portion thereof is shown in FIG. 1 to FIG. 10. Starting point for operation of the apparatus 100 is an adhesive stretchable tape 108 mounted on temporary annular frame 126 (which may be made of metal). The wafer 104 of the chips 102 is adhered to a sticky surface of the adhesive tape 108. The tape 108 may have a plastic carrier (such as PVC, polyvinylchloride) foil and an adhesive layer applied thereon. During an expansion described below in more detail, the tape 108 may be stretched for example by 10% to 20%, depending on a desired distance between adjacent chips 102 after expansion.

Referring to FIG. 1, the apparatus 100 comprises an expansion mechanism 106 configured for expanding the adhesive stretchable tape 108. The chips 102 of the wafer 104 are arranged on a central chip carrying portion 112 of the tape 108. According to FIG. 1, the wafer 104 has already been sawn by a laser or a plasma process so that the chips 102 are already separated from one another. However, since the chips 102 may still be located in very close relationship to one another or may even be still slightly connected to one another, further expansion of the chips 102 of the wafer 104 may be desired, also for simplifying a subsequent pick and place procedure executed with the chips 102. In this context, the term "expansion" may denote an increase of the lateral distance between the individual chips 102 on the tape 108.

Figure 12:
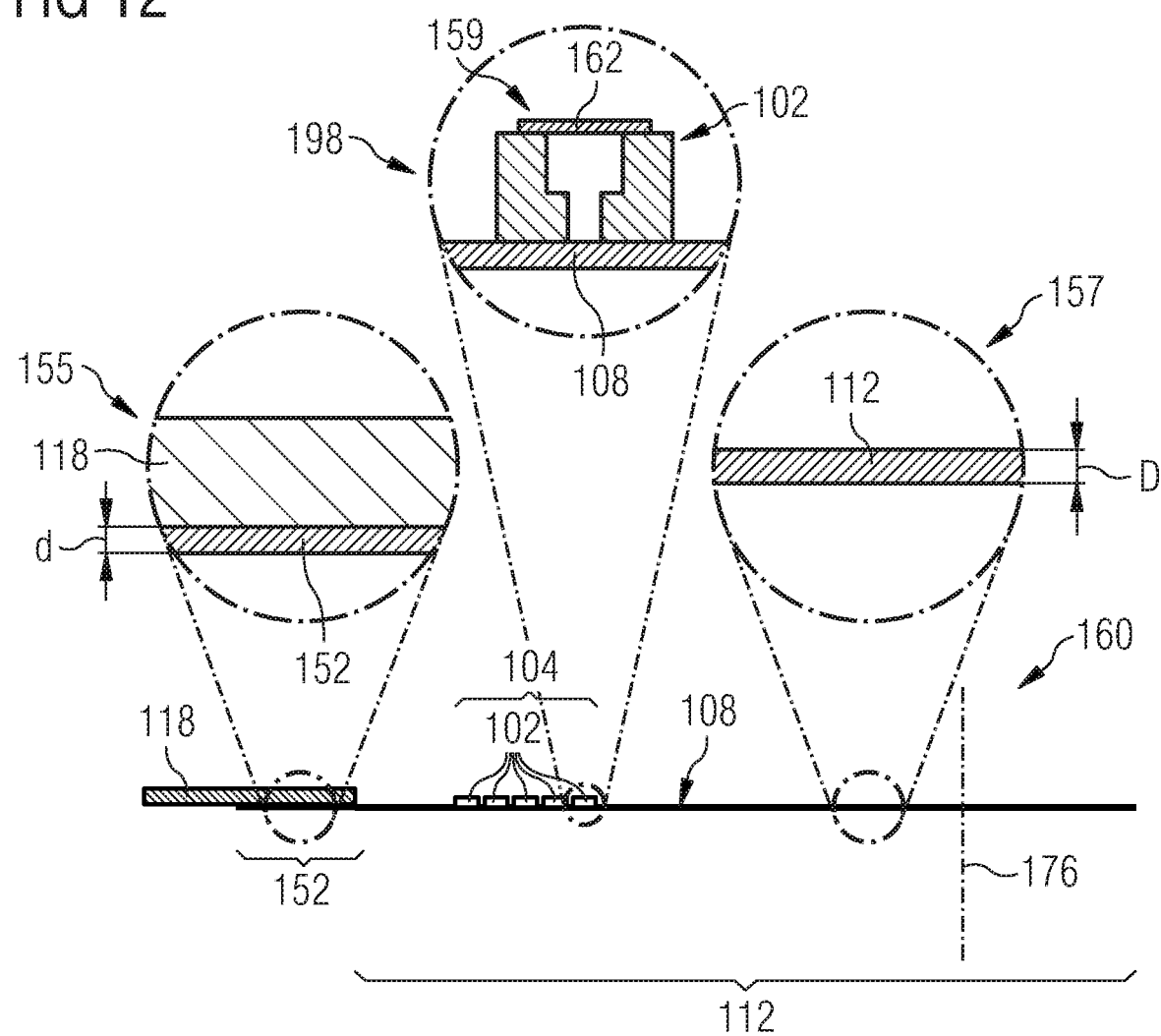
FIG. 12 shows an arrangement of a frame, a tape and an expanded wafer according to an exemplary embodiment.

As can be taken from FIG. 12, a final frame 118 (which may have an annular shape, and which may be made for example from a plastic material) holds the expanded tape 108, in turn carrying the expanded wafer 104, in the finally manufactured arrangement 160.

However, in the operation mode of the apparatus 100 according to FIG. 1, an end portion 122 of the tape 108 is mounted on the temporary further frame 126 (which can be a sawing frame). During an expanding procedure and a clamping procedure being described below in further detail, the end portion 122 of the tape 108 remains connected to further frame 126. Thus, the expansion mechanism 106 is configured for fixing end portion 122 of the tape 108 and for exerting a pulling force (see reference numeral 174) to the end portion 122 to thereby spatially expand the tape 108. As can be taken from arrow 174 in FIG. 1, the expansion mechanism 106 is configured for exerting the pulling force to the end portion 122 along a vertical direction which is angled by 90° relative to the horizontal chip carrying portion 112 of the tape 108. More precisely, the expansion mechanism 106 is configured for fixing the further frame 126 connected with the end portion 122 of the tape 108 during expanding, clamping and inflating, as described below. For this purpose, a support structure 170 and a further support structure 124 may clamp the further frame 126 and the end portion 122 of the tape 108. An optional seal 172 is provided as well.

Figure 4:
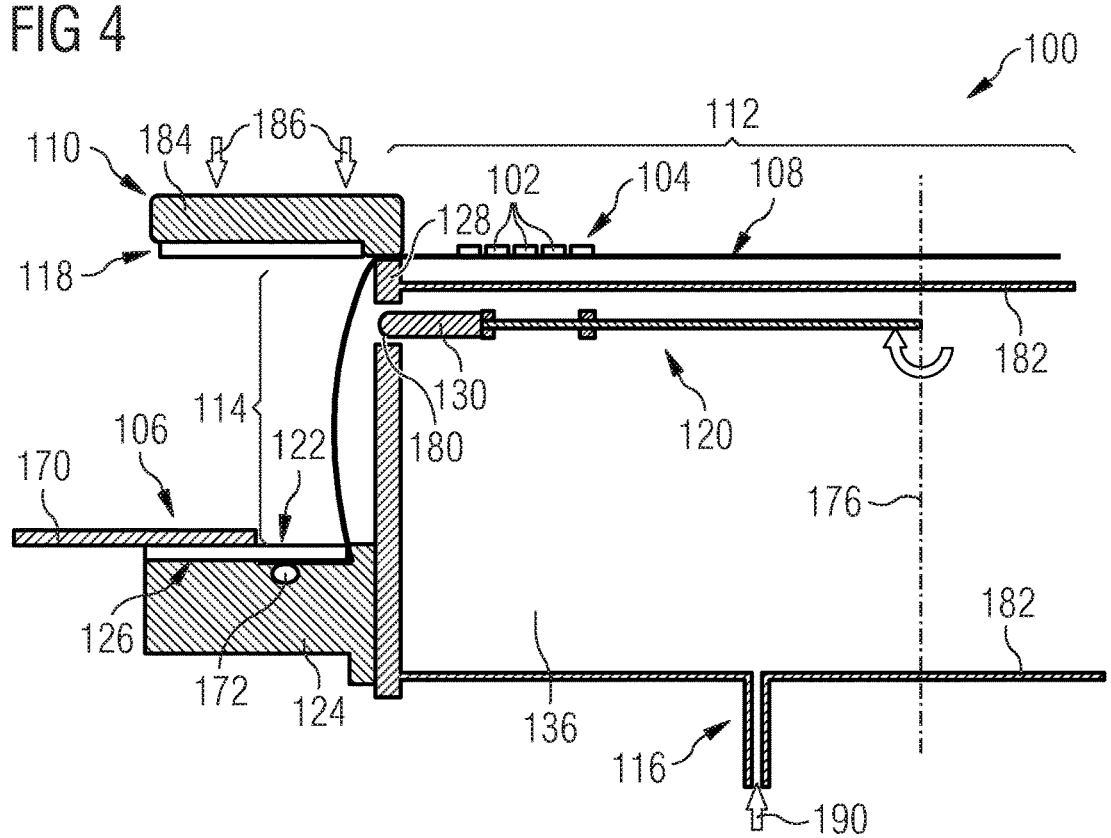

Furthermore, the apparatus 100 comprises an inflation mechanism 116 configured for inflating an edge portion 114 (see FIG. 2) of the tape 108 in the operation mode according to FIG. 4 so that part of the edge portion 114 approaches frame 118. For inflation, the inflation mechanism 116 may pump pressurized air into an inflation chamber 136 being delimited by casing 182 having an outlet 180 through which the pressurized air may be brought in interaction with the edge portion 114. As will be described below in further detail, the inflation mechanism 116 is hence configured for inflating the edge portion 114 by applying a pneumatic pressure.

Figure 7:
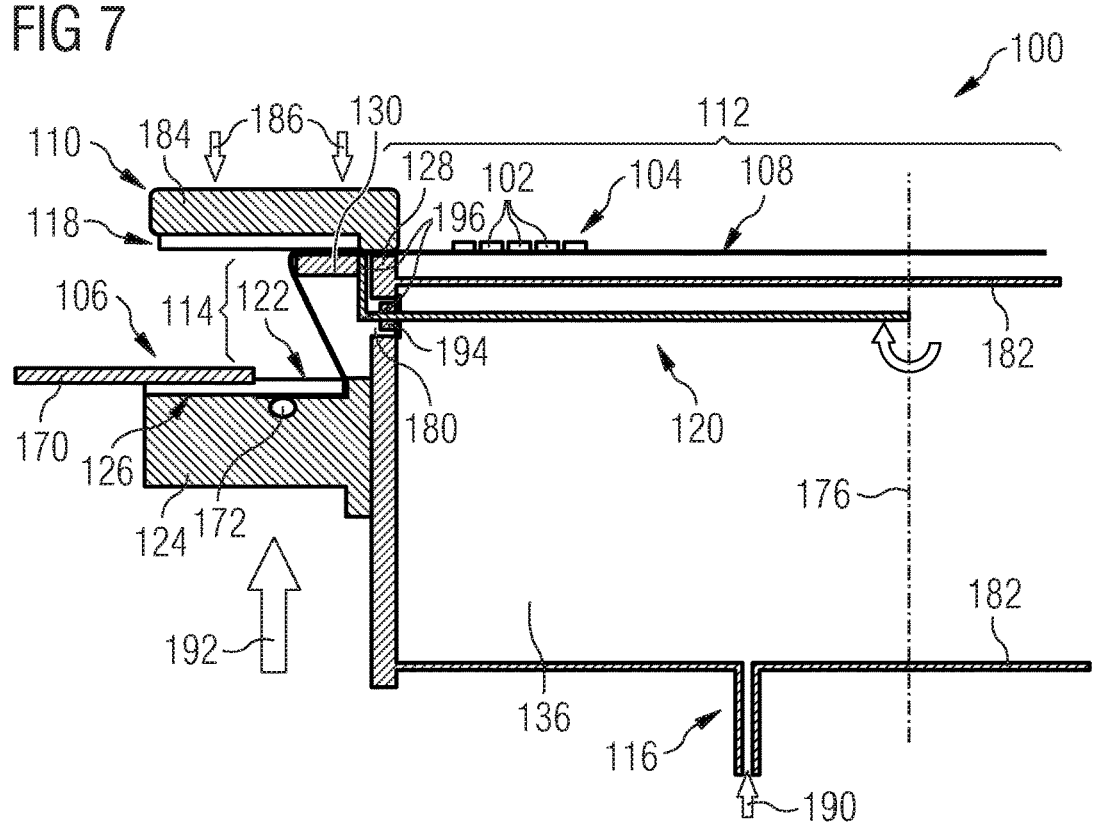
Figure 8:
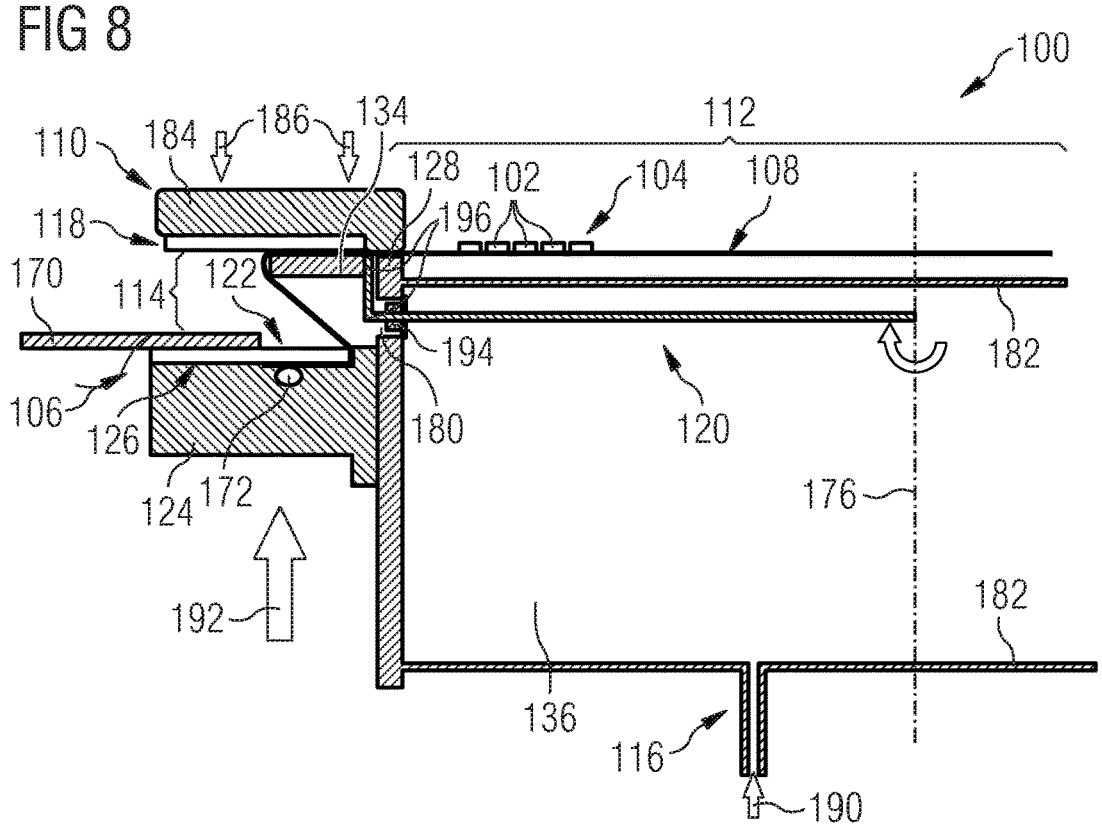

A contacting mechanism 120 of the apparatus 100 is configured for bringing the approached inflated part of the tape 108 in contact with the frame 118. This will be described in more detail referring to FIG. 7 and FIG. 8. In particular, the contacting mechanism 120 may be embodied as roll mechanism for rolling the approached part onto the frame 118. For this purpose, the contacting mechanism 120 comprises a roll 130 (and a further roll 134, not shown in FIG. 1) configured for rolling the approached inflated part in contact with the frame 118. The contacting mechanism 120 is hence configured for securely connecting the inflated part with the frame 118, as shown in FIG. 7 and FIG. 8.

As can be taken from FIG. 1, the tape 108 with the chips 102 of the wafer 104 held by further frame 126 is mounted on the casing 182 and is clampingly fastened at expansion mechanism 106.

In the following, a method of expanding the chips 102 on the wafer 104 and for manufacturing the arrangement 160 shown in FIG. 12 will be described:

According to FIG. 1, the tape 108 (and consequently the chips 102 adhered thereon) are expanded by moving the expansion mechanism 106 downwardly, see reference numeral 174. Consequently, a portion of the tape 108 is bent around a corner at bending edge 128 and moves along the bending edge 128 and further downwardly.

Figure 2:
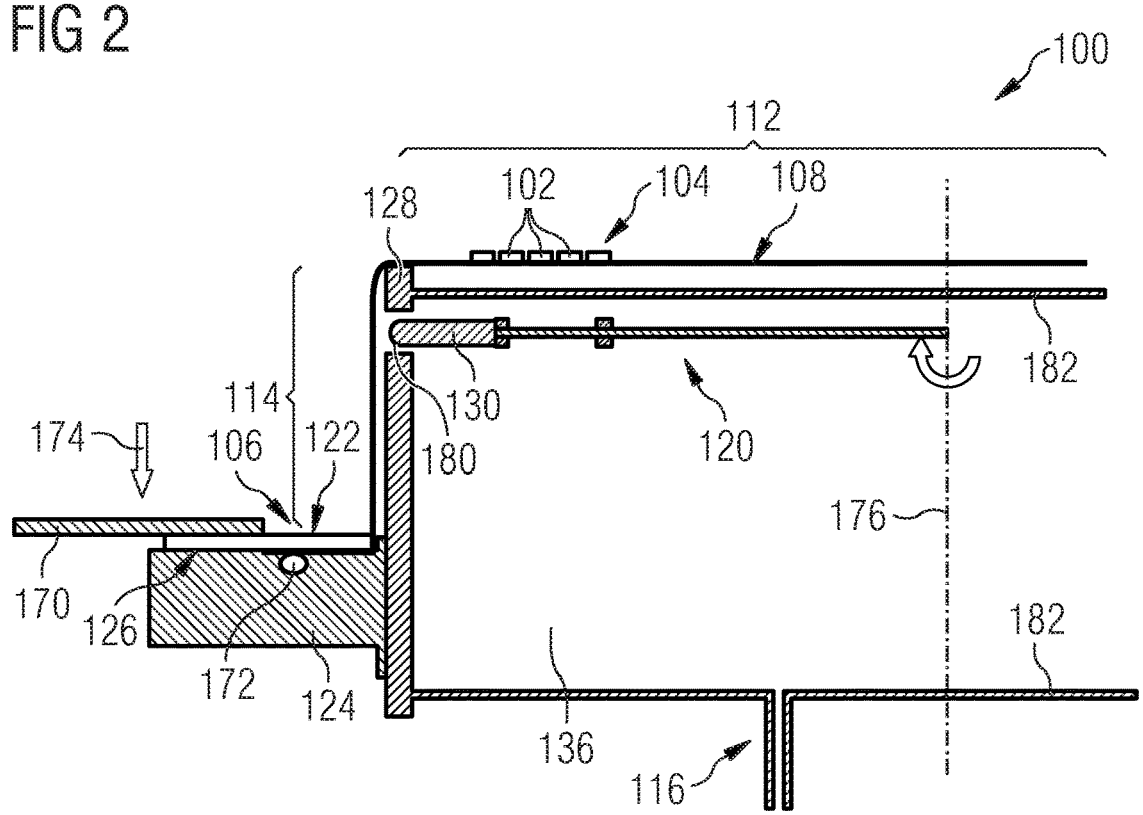

Referring to FIG. 2, an operation mode is shown in which the expansion mechanism 106 has already reached a lower end position so that the tape 108 on which the chips 102 of the wafer 104 are arranged is now in a stretched and expanded state. Correspondingly (but not shown in the figures), a distance between adjacent chips 102 has been increased.

Figure 3:
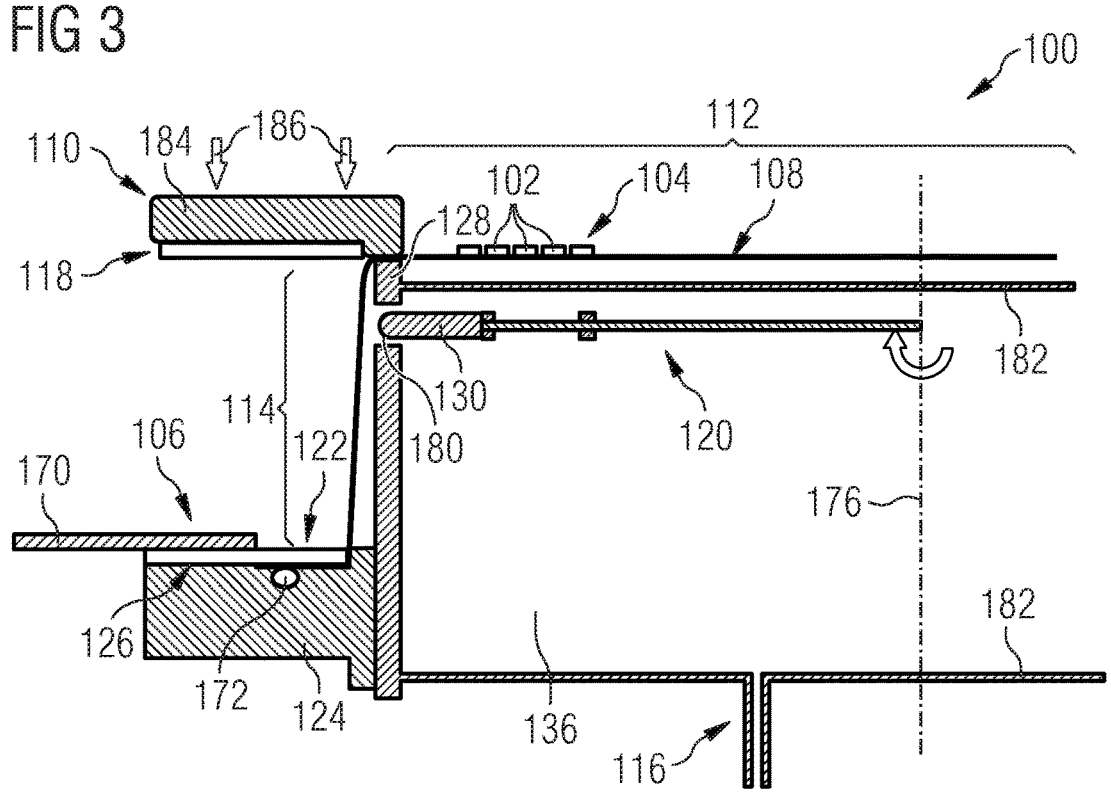

Referring to FIG. 3, a clamping mechanism 110 of the apparatus 100 is now mounted on the bending edge 128 to thereby clamp the expanded tape 108 at a position of the bending edge 128 and hence between the chip carrying portion 112 of the tape 108 and the edge portion 114 of the tape 108. More precisely, the clamping mechanism 110 is configured for clamping the expanded tape 108 by clamping the tape 108 between a further support structure 184 and bending edge 128. The further support structure 184 may be made of a non-adhesive and non-adhering material (such as PTFE, Polytetrafluoroethylene), so that the support structure 184 only temporarily presses on the adhesive tape 108 for clamping, but does not adhere to the tape 108. Exertion of a clamping force is indicated schematically by arrows 186. As can be taken from FIG. 3, the additional final frame 118 is located on the further support structure 184 adjacent to the bending edge 128. For instance, frame 118 may be held temporarily on the further support structure 184 by a vacuum suction mechanism. This geometry simplifies subsequent connection of a portion of the tape 108 with the frame 118. Advantageously, frame 118 and further frame 126 have the same size (in the shown example 12"). Thus, the final arrangement 160 (compare FIG. 12) can be shipped with a relatively small size regardless of the expansion procedure. Hence, FIG. 3 illustrates clamping of the expanded tape 108 at a position between chip carrying portion 112 of the tape 108 and edge portion 114 of the tape 108.

Referring to FIG. 4, the inflation mechanism 116 is activated. Thus, pressurized air (for instance with a pressure in a range between 50 kPa and 100 kPa) is introduced into the inflation chamber 136, as indicated schematically by reference numeral 190. The pressurized air escapes through the outlet 180 and expands and thereby further stretches the edge portion 114 of the tape 108. As the inflation mechanism 116 inflates the edge portion 114, the edge portion 114 assumes a toroidal shape. FIG. 4 furthermore shows that the inflation mechanism 116 is configured for inflating the edge portion 114 while the chip carrying portion 112 is protected from being inflated. Due to the described inflation of the edge portion 114 of the tape 108, part of the edge portion 114 spatially approaches frame 118.

Figure 5:
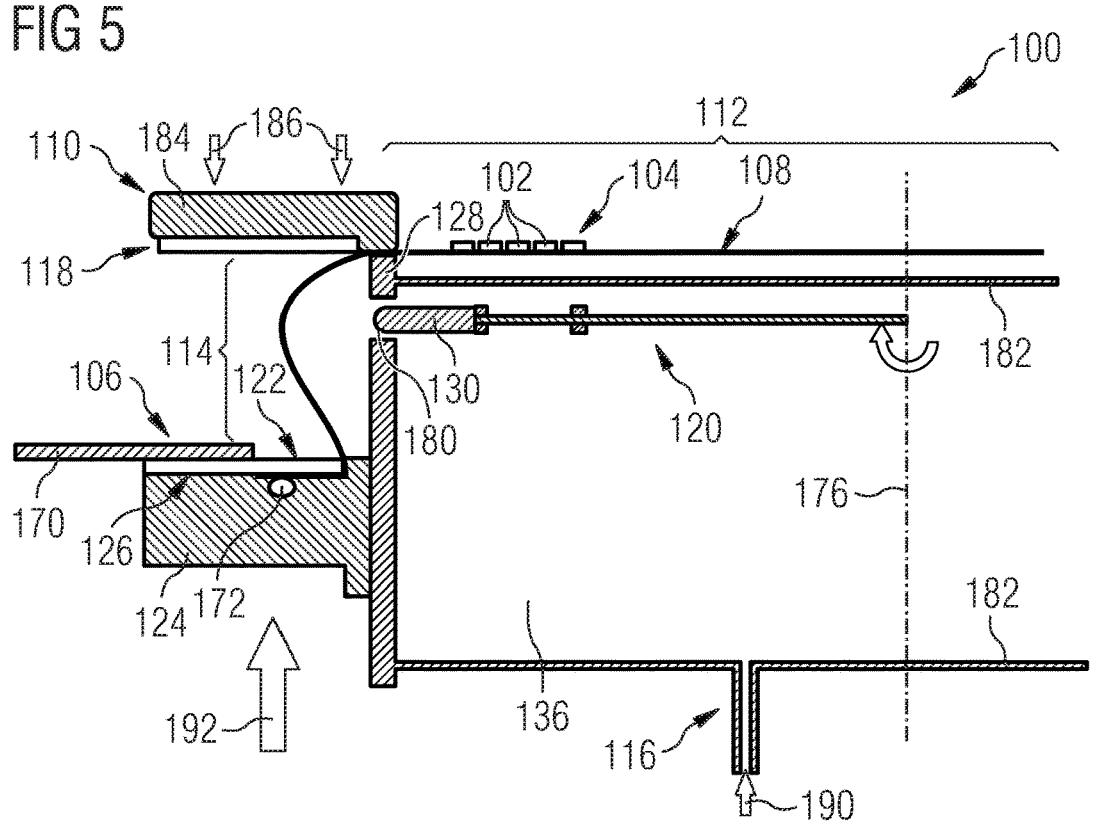

FIG. 5 shows that the expansion mechanism 106 and the clamping mechanism 110 are moved relative to one another for further approaching the inflated part towards the frame 118. More specifically, the expansion mechanism 106 is moved again upwardly, as indicated by arrow 192. Thereby, the inflated part of the tape 108 is moved closer to frame 118.

Figure 6:
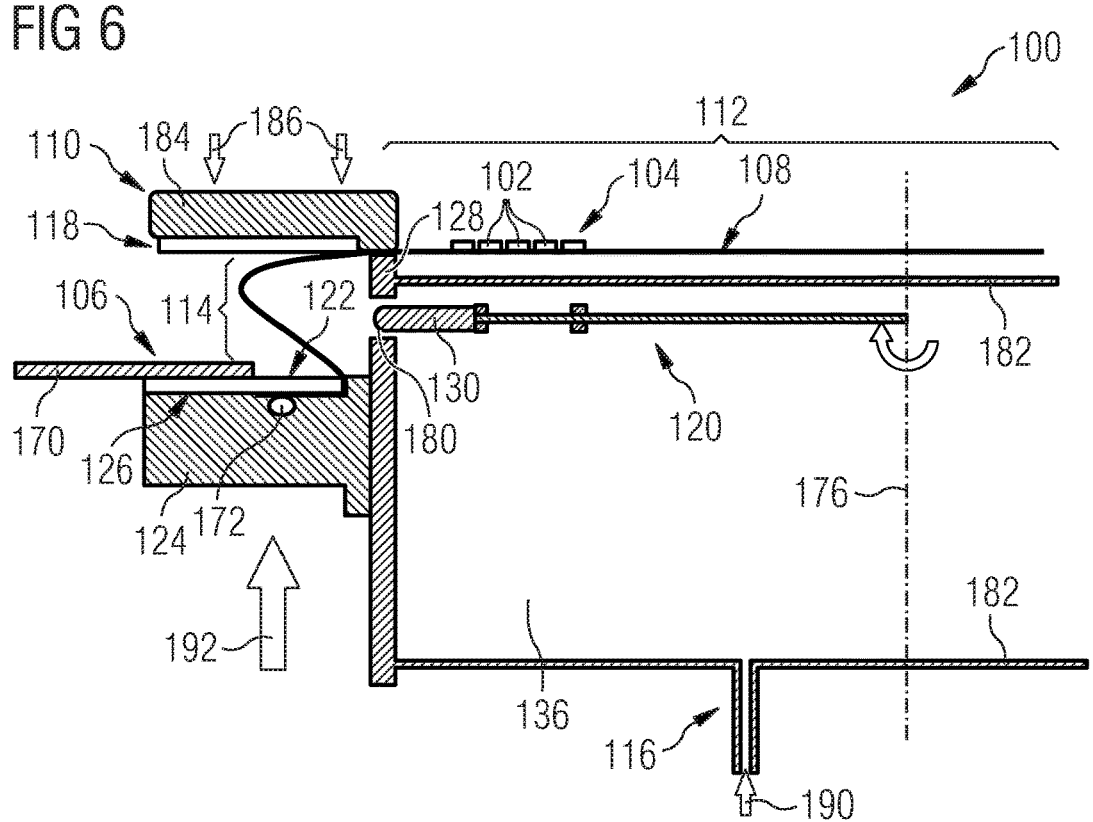

Referring to FIG. 6, the procedure described referring to FIG. 5 is continued. The inflation mechanism 116 in cooperation with the expansion mechanism 106 hereby function for approaching a part of the edge portion 114 of the tape 108 close to frame 118.

Referring to FIG. 7, the contact mechanism 120 is activated. Thereby, the contacting mechanism 120 brings the approached inflated part of the tape 108 in physical contact with the frame 118. In the shown embodiment, the contacting mechanism 120 brings the approached inflated part in contact with the frame 118 by applying a rolling force. More specifically, the contacting mechanism 120 rolls the approached part onto the frame 118. This is accomplished by converting the contacting mechanism 120 from an inactive configuration in which the roll 130 is retracted in an interior of the inflation chamber 136 (compare FIG. 6) into an active configuration in which the roll 130 is driven through the outlet 180 to an exterior of the inflation chamber 136 and hence in functional relationship with the edge portion 122 of the tape 108 in relation to frame 118. In this active configuration, a support bearing 194 rests on the outlet 180, and two bending arms of the contact mechanism 120 are pivoted around two hinges 196 in such a manner that the roll 130 applies a rolling pressure which presses the uppermost part of the edge portion 122 of the tape 108 against the frame 118 supported by the support structure 184. As a result, the uppermost part of the edge portion 122 of the tape 108 is fixedly connected to the frame 118 by an adhesive force.

Referring to FIG. 8, the expansion mechanism 106 may continue its upward motion towards the clamping mechanism 110. As a result, the tape 108 may be allowed to relax after rolling with the roll 130. As can be taken from FIG. 8, the contacting mechanism 120 comprises a further roll 134 configured for further rolling the approached inflated part of the tape 108 in contact with the frame 118 after rolling with the roll 130 and after relaxing of the tape 108. The rolling performance of the contact mechanism 120 using the further roll 134 substantially corresponds to the rolling performance of the contact mechanism 120 using roll 130, so that reference is made to the corresponding description referring to FIG. 7. However, the further roll 134 is larger than the roll 130 so as to roll a larger part of the tape 108 onto the frame 118, thereby further intensifying the roll-on procedure and consequently the fixation of the tape 108 on frame 118.

As already mentioned, both the roll 130 and the further roll 134 are each convertible between an expanded and a retracted configuration. They may be stored, in an inactive state, within an inflation chamber 136 of the inflation mechanism 116 (compare FIG. 1 to FIG. 6). They may be driven out of the inflation chamber 136 in an active state (compare FIG. 7 and FIG. 8).

Figure 9:
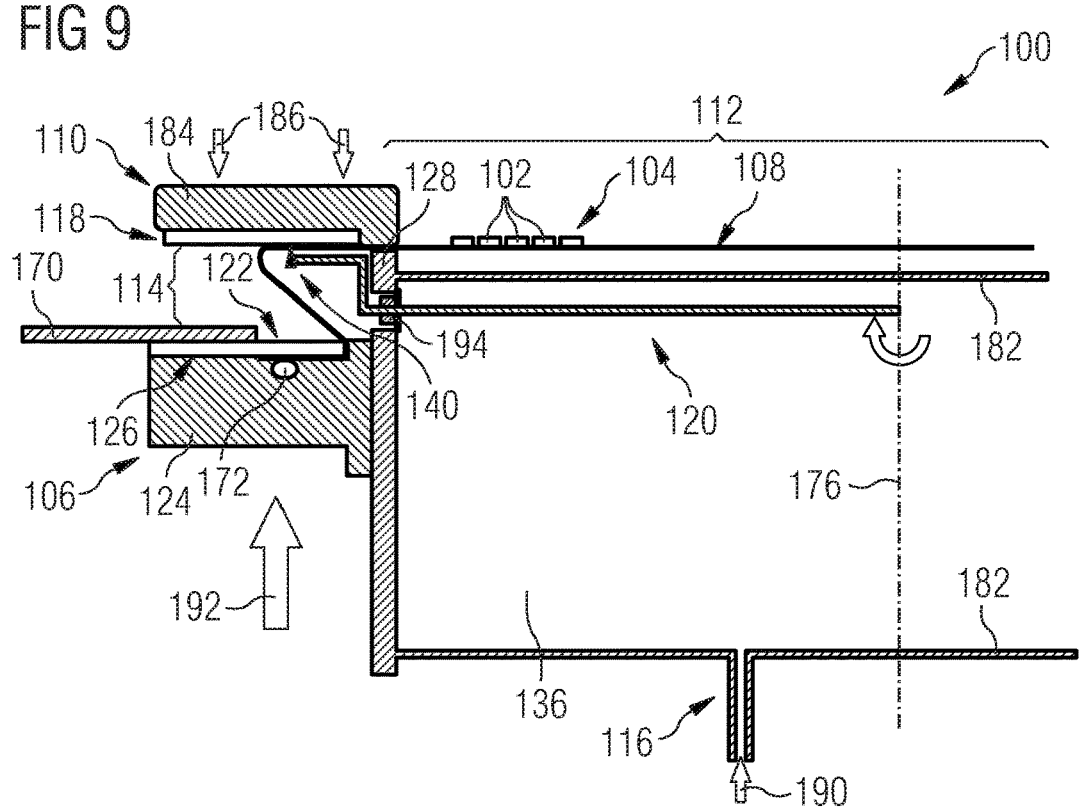

Referring to FIG. 9, a non-connected free section of the edge portion 122 of the tape 108 may be separated from the rest of the tape 108. For this purpose, the apparatus 100 furthermore comprises a cutting mechanism 140 configured for cutting off a part of the edge portion 114 of the tape 108 being not in contact with the frame 118. Also the cutting mechanism 140 may be convertible between an expanded and a retracted configuration. The cutting mechanism 140 may be stored, in an inactive state, within inflation chamber 136 and may be driven out of the inflation chamber 136 in an active state (compare FIG. 9 and FIG. 10). The cutting performance of the cutting mechanism 140 using a cutting blade (for instance a cut wheel or a round knife) substantially corresponds to the rolling performance of the contact mechanism 120 using roll 130, so that reference is made to the corresponding description referring to FIG. 7.

Figure 10:
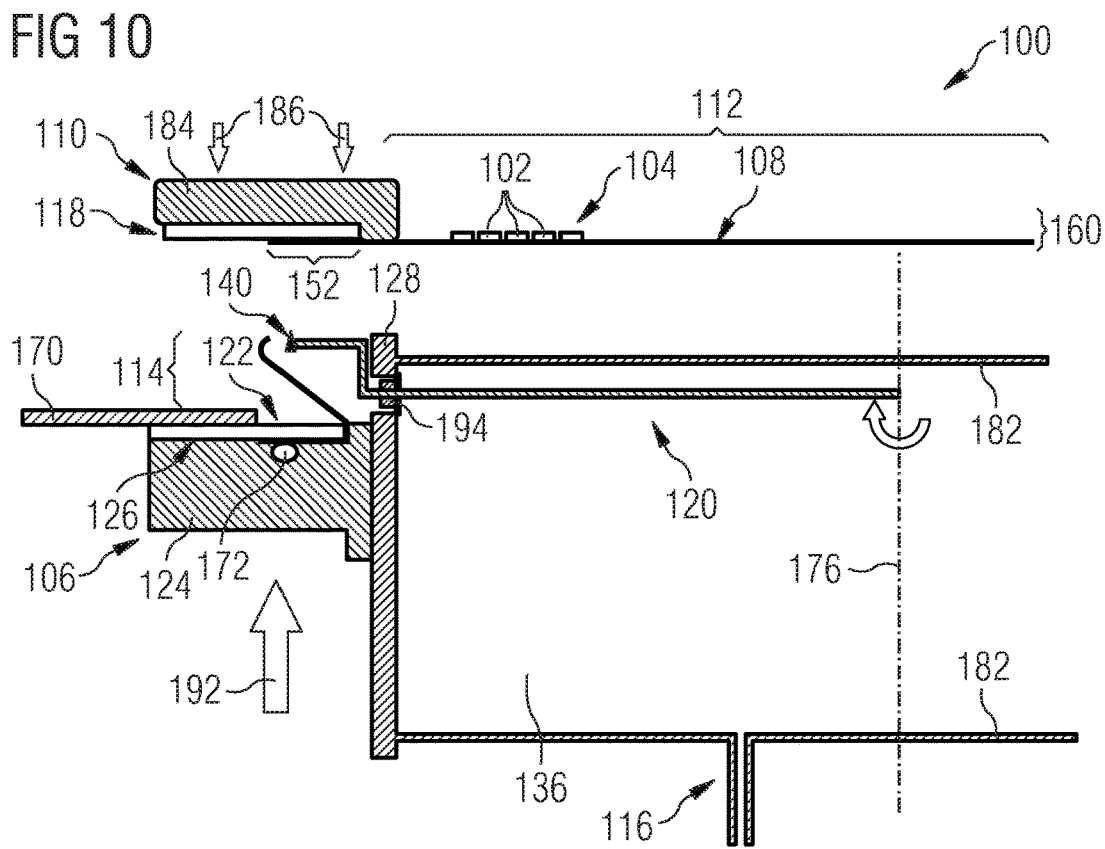

Referring to FIG. 10, the clamping performance of the clamping mechanism 110 is released and expanded wafer arrangement 160 with still connected clamping mechanism 110 can be lifted or taken off from the rest of the apparatus 100. By separating the clamping mechanism 110 from the arrangement 160 (for instance by deactivating the above described vacuum suction mechanism), the manufacturing process of the arrangement 160 is completed. An expanded connection portion 152 of the tape 108 remains securely attached to frame 118. Reference is made to FIG. 12 for a detailed description of the arrangement 160.

Figure 11:
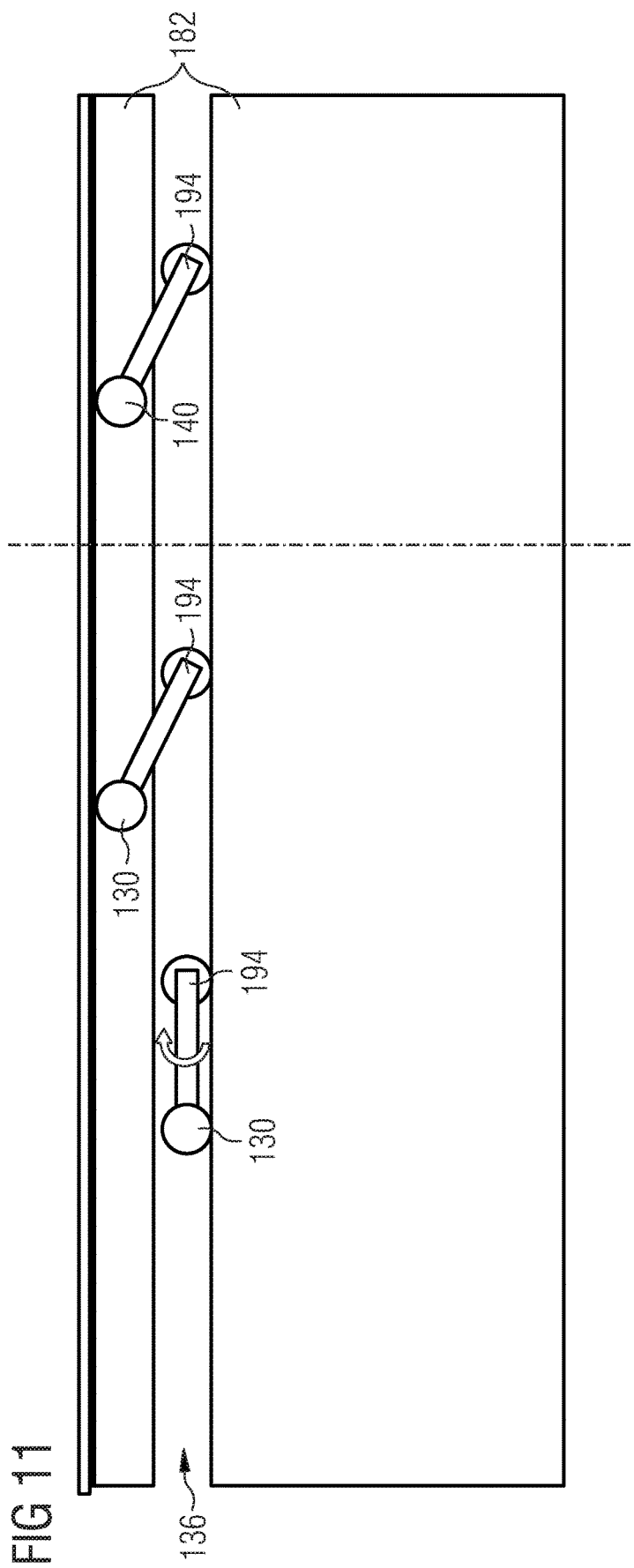
FIG. 11 is a detailed illustration of individual elements of the apparatus according to FIG. 1 to FIG. 10.

FIG. 11 is a detailed illustration of individual elements of the apparatus 100 according to FIG. 1 to FIG. 10. In particular, FIG. 11 shows details of the roll-on mechanism and the cut arm (in a side view).

The left hand side of FIG. 11 shows the roll 130 in a retracted state in an interior of the inflation chamber 136. In the central portion of FIG. 11, the roll 130 including its motion mechanism is shown after having driven the roll 130 out of the inflation chamber 136, by a motion perpendicular to the paper plane of FIG. 11. The right hand side of FIG. 11 shows the cutting mechanism 140 after having driven the cut wheel out of the inflation chamber 136, by a motion perpendicular to the paper plane of FIG. 11.

FIG. 12 shows arrangement 160 of frame 118, tape 108 and expanded wafer 104 according to an exemplary embodiment. The arrangement 160 may be formed as described above referring to FIG. 1 to FIG. 10.

The arrangement 160 is hence composed of the adhesive tape 108, the plurality of chips 102 of the expanded wafer 104 adhered on the expanded chip carrying portion 112 of the tape 108, and the frame 118 on which expanded connection portion 152 of the tape 108 is adhered. In particular and as shown in details 155 and 157, the tape 108 has a smaller thickness, d, in the expanded connection portion 152 than a larger thickness, D, in the expanded chip carrying portion 112. As a result of the above described manufacturing procedure, at least the part of the expanded connection portion 152 on the left hand side is adhered on the frame 118 under mechanical tension acting along a horizontal direction of FIG. 12.

As can be taken from a detail 198, the chips 102 have an exterior main surface 159 opposing the tape 108 with an exposed integrated circuit element 162 which would be destroyed when being directly adhered onto an adhesive tape. More specifically, the chips 102 are here MEMS chips with a thin and sensitive movable membrane as exposed integrated circuit element 162. Adhering the membrane on a sticky tape would damage the membrane and hence the chips 102. Since relamination of the expanded wafer 104 using different tapes is dispensable according to embodiments of the invention, the described manufacturing method is flexibly usable for very different chip types, including those with sensitive main surface 159. In view of the described manufacturing method, the frame 118 may be as small as 12".

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. An apparatus for expanding chips of a wafer, wherein the apparatus comprises:
   an expansion mechanism configured for expanding a tape on which the chips of the wafer are arranged;
   an inflation mechanism configured for inflating at least a part of an edge portion of the tape so that part of the edge portion approaches a frame;
   a clamping mechanism configured for clamping the extended tape at a position between a chip carrying portion of the tape and the edge portion of the tape prior to the inflating,
   wherein the clamping mechanism is configured for clamping the expanded tape between a support structure and a bending edge over which the tape is bent during expanding,
   a contacting mechanism configured for bringing the approached inflated part in contact with the frame,
   wherein the contacting mechanism comprises a roll configured for rolling the approached inflated part onto the frame.

2. The apparatus according to claim 1, wherein the inflation mechanism is configured for inflating the edge portion while a chip carrying portion of the tape is protected from being inflated.

3. The apparatus according to claim 1, wherein the contacting mechanism is configured for bringing the approached inflated part in contact with the frame by one of the group consisting of applying pressure and applying a rolling force.

4. The apparatus according to claim 1, wherein the expansion mechanism is configured for exerting a pulling force to an end portion of the tape to thereby expand the tape.

5. The apparatus according to claim 4, wherein the expansion mechanism is configured for exerting the pulling force to the end portion along a direction which is angled relative to the chip carrying portion of the tape.

6. The apparatus according to claim 4, wherein the expansion mechanism is configured for fixing a further frame connected with the end portion of the tape during expanding and inflating.

7. The apparatus according to claim 6, wherein the frame and the further frame have the same size, in particular 12".

8. The apparatus according to claim 1, wherein the frame is located on the support structure adjacent to the bending edge.

9. The apparatus according to claim 1, wherein the inflation mechanism is configured for inflating the edge portion by applying one of the group consisting of a pneumatic pressure and a hydraulic pressure.

10. The apparatus according to claim 1, wherein the contacting mechanism is configured for securely attaching, in particular adhering, the approached inflated part of the tape to the frame.

11. The apparatus according to claim 1, wherein the expansion mechanism and the clamping mechanism are configured for being movable relative to one another for further approaching the inflated part of the tape towards the frame.

12. The apparatus according to claim 1, wherein the roll is convertible between an expanded configuration and a retracted configuration.

13. The apparatus according to claim 1, wherein the roll is stored, in an inactive state, within an inflation chamber of the inflation mechanism.

14. The apparatus according to claim 1, comprising a separation mechanism configured for separating a part of the edge portion of the tape being not in contact with the frame.

15. An apparatus for expanding chips of a wafer, wherein the apparatus comprises:
- an expansion mechanism configured for expanding a tape on which the chips of the wafer are arranged;
- a clamping mechanism configured for clamping the expanded tape at a position between a chip carrying portion of the tape and an edge portion of the tape, wherein the clamping mechanism is configured for clamping the expanded tape between a support structure and a bending edge over which the tape is bent during expanding,
- a contacting mechanism configured for bringing the approached inflated part in contact with a frame,
- wherein the contacting mechanism comprises a roll configured for rolling the approached inflated part onto the frame,
- an approaching mechanism configured for approaching at least a part of the edge portion of the tape to a frame.

* * * * *